GAS DIFFUSION METHOD FOR FABRICATING SEMICONDUCTOR DEVICES

Filed April 5, 1968

INVENTOR

HARVEY W. BELL III

United States Patent Office 3,553,037
Patented Jan. 5, 1971

3,553,037
GAS DIFFUSION METHOD FOR FABRICATING SEMICONDUCTOR DEVICES

Harvey W. Bell III, San Jose, Calif., assignor to Stewart-Warner Corporation, Chicago, Ill., a corporation of Virginia Filed Apr. 5, 1968, Ser. No. 719,174
Int. Cl. H01l 7/00, 7/44
U.S. Cl. 148—189 2 Claims

ABSTRACT OF THE DISCLOSURE

A supporting device for semiconductor wafers to be used during deposition and diffusion process steps by which the wafers are oriented at an upward sloping angle in the direction of gas flow. The wafers are loaded on the devices so that the surfaces at which the semiconductor devices are being fabricated are facing downward and towards the downstream end to thereby provide an even gas flow across the face of each wafer and prevent the deposit on the desired surfaces of any contaminants which might be knocked loose from the interior surface of the reaction tube.

Semiconductor devices such as discreet diodes and transistors or integrated circuits are usually fabricated on thin wafers of semiconductor material. Layers of different current type carrier impurities are developed by subjecting the wafers to a flow of gas containing the impurities while subjecting the wafers to an elevated temperature usually within the confines of an extended quartz tube in a diffusion furnace. Ordinarily, the wafers are laid side by side on an elongated supporting device or boat having a flat upper surface. The loaded boat is placed in the reaction tube of a furnace which is capable of heating the wafers to a temperature of around 1100 to 1300° C. The impurity doped gas is flowed through the tube, and as it passes across the surfaces of the wafer causes the diffusion of the impurity material through windows in an impurity pervious mask covering the wafers.

A basic problem in the fabrication of semiconductor devices is the prevention of contaminant materials from being deposited on the wafer surfaces during the gas flow process steps and during the removal of the wafer boat from the furnace tube. The flowing gases quite expectedly cause particles to adhere to the inside walls of the tube which may later fall on to the wafer surface and ruin the semiconductor devices located at those spots. This is especially true in the emitter deposition and diffusion steps as well as the gold diffusion steps in the processing of transistors since the impurity concentration in the gases used are so high. When the wafer loaded boat is subsequently removed from the furnace tube, jarring of the tube cannot be helped which shakes loose contaminant particles to fall on the wafer surfaces. Some manufacturers seek to overcome this problem by placing the wafers on the boat with the surface upon which the devices are to be formed facing downward in contact with the boat. The flow of gas between the wafer and the surface of the boat is somewhat disturbed by this procedure, however, making it more difficult to obtain uniform results for the particular process step. Other manufacturers overcome this problem by frequently cleaning the quartz reactor, sometimes as often as after each run. This not only adds a time consuming step to the process, but also subjects the expensive tubes to possible breakage. Furthermore, frequent cleaning of the tube affects the process repeatability because a stabilized coating of dopant material on the inner wall of the tube is prevented from forming.

The wafer boats previously used, on which the wafers were laid side by side, limited the number of wafers which could be handled during a process run, the diameter of the wafer used controlling the maximum number of wafers that could be processed during each run. This is true, of course, whether the wafers are processed with their active surfaces facing upward or downward.

Furthermore, the use of a wafer boat having a large flat surface upon which to support the wafers dictates that the mass of the boat be relatively high. The boats have a relatively high thermal inertia which can be quite detrimental if it is desired to provide quick cooling of wafers after a process step. For example, in the fabrication of digital transistors, where gold is diffused into the devices for the reduction of minority carrier lifetime, it is necessary that the wafers be quickly cooled after the emitter formation steps to prevent the out diffusion of the gold particles. A high mass flat bed boat of the type being predominantly used in the industry can make it quite difficult to quick cool the wafer.

There is provided herein by this invention a wafer supporting boat of lattice type construction which supports the wafers in a sloping orientation with respect to the reaction furnace tube. The active surfaces of the wafers are oriented with their active surface facing substantially downward and downstream to minimize the deposit thereon of particles shaken loose from the interior walls of the tube. The dopant gases flow evenly across the active surfaces of the wafer by the flow through the bottom of the tube to the open lattice boat and the interstice between adjacent wafers. Likewise, the open lattice framework substantially reduces the mass and, hence, thermal inertia of the wafer boat permitting quick cooling of the wafers. In addition, many more wafers are supported on the boat for processing during a particular run since the number of wafers is governed, not by the dimensions of the wafer, but the space required between the wafers for efficient gas flow.

This invention will be better understood by a further reading of the specification, especially when taken in view of the accompanying drawings in which.

Figure 2:
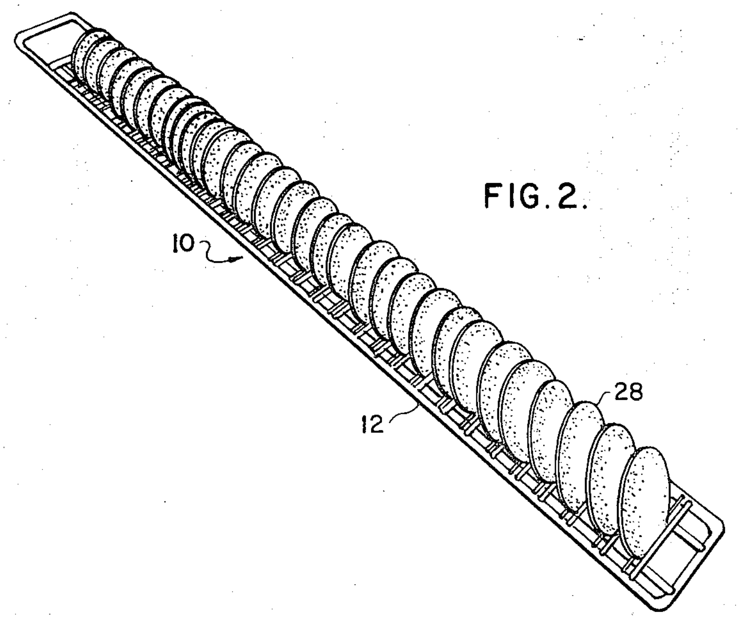
FIG. 2 is an isometric view of a wafer boat carrying a load of wafers.
Figure 1:
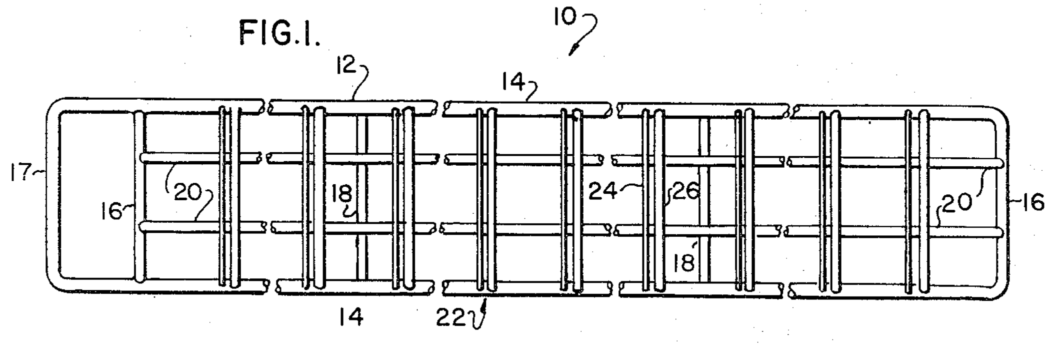
FIG. 1 is a plan view, partially broken, of a wafer boat embodying the teachings of this invention.

The boat 10 comprises an elongated rectangular frame 12 comprising two side pieces 14 joined at the end by end pieces 16. A handle 17 is provided at one end to enable handling in the furnace tube. Spacing strips 18 are provided at various locations along the underside of the frame 12. There are a pair of elongated rods 20 extending parallel to the end pieces 14 and joining the end pieces 16. The rods 20 serve to prevent the wafers 28 from slipping down through the wafer boat.

The wafers are held in their slanting position by means of transverse pairs of rods 22 comprising a smaller diameter rod 24 and a larger diameter rod 26 spaced from one another at a distance to permit the slanting orientation of the wafer at the desired angle. For best results, it has been found that the plane of the wafers should be at an angle greater than 45 degrees but less than 90 degrees to a vertical normal to the tube axis and should be parallel to a horizontal normal to the tube axis. The rods 24,26 lay across the top of the elongated rods 20 and are joined to the top of the side pieces 14 of the frame 12. Preferably, the rods 24, 26 are not joined to the elongated rods 20 so as to provide as little obstruction to the gas flow as possible. As may be seen in FIGS. 2 and 3, the wafers 28 are placed between the rods 24, 26 with their bottom edges engaging the longitudinally extending rods 20 to prevent them from slipping through the lattice. All of the components making up the wafer boat 10 are preferably fabricated of quartz to reduce the amount of contaminant in the reactor tube during the process.

Figure 3:
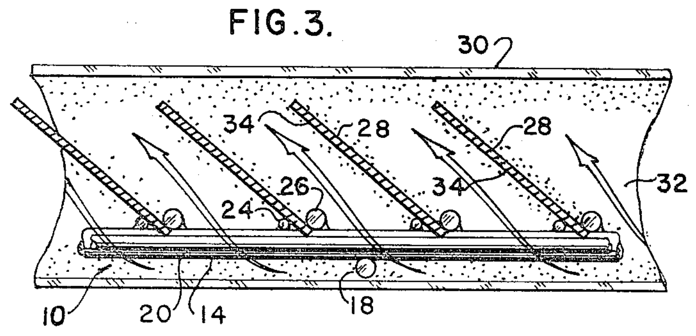
FIG. 3 is a partial section of the loaded wafer boat of FIG. 2 showing its placement within the reactor tube of a process furnace.

FIG. 3 shows how the loaded boat 52 is disposed in the reactor tube 30 of a reaction furnace. The gas containing the impurity dopant flows in the direction of the arrows 32 from the lower part of the tube 30 through the open lattice frame and between the wafers 28. The surfaces referenced 34 have open portions cut away in the masks (not shown) so that the impurity particles may deposit thereon and diffuse into wafer 28.

This orientation of the wafers enabled by the boat construction reduces the problem of particles dropping on to the active surfaces from the inner wall of the reactor. There is no longer any reason for frequent cleaning of the furnace tube so that a stabilizing coating of dopant material may form in the tube. In addition, more wafers may be processed per run in a furnace having a given lenth reactor tube. Furthermore, the open lattice construction reduces the thermal inertia of the boat to enable quicker cooling of the wafers if desired.

While there has been described herein a single embodiment of the invention, it is understood that many modifications and/or additions may be made thereto without materially deviating from the teachings of this invention. Hence, it is intended to be bound only by the scope of the appended claims.

What is claimed is:

1. In a process for the fabrication of semiconductor devices at one surface of a semiconductor wafer wherein said wafer is subjected to the flow of gases containing source materials for diffusion into said wafer in a substantially horizontally disposed reaction tube, the improvement wherein said wafer is supported with its one surface at an angle to the axis of said tube facing downward and toward the downstream end of said tube.

2. In the process of claim 1 wherein said wafer is supported with its one surface at an angle greated than 45 degrees but less than 90 degrees from a vertical normal to the axis of the process tube and parallel to a horizontal normal to the axis of the process tube.

References Cited

UNITED STATES PATENTS 3,374,125 3/1968 Goldsmith ---------- 148—189

L. DEWAYNE RUTLEDGE, Primary Examiner

R. A. LESTER, Assistant Examiner

U.S. Cl. X.R.

148—186, 187, 188